United States Patent
Chou et al.

(10) Patent No.: US 10,872,189 B2
(45) Date of Patent: Dec. 22, 2020

(54) UNI-GATE CELL DESIGN

(71) Applicant: Taiwan Semiconductor Manufacturing Co., Ltd., Hsinchu (TW)

(72) Inventors: Wen-Shen Chou, Zhubei (TW); Po-Zeng Kang, Hsin-Hua (TW); Yung-Chow Peng, Hsinchu (TW); Yung-Hsu Chuang, Hsinchu (TW); Yu-Tao Yang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 45 days.

(21) Appl. No.: 16/102,946

(22) Filed: Aug. 14, 2018

(65) Prior Publication Data
US 2019/0179993 A1   Jun. 13, 2019

Related U.S. Application Data

(60) Provisional application No. 62/598,304, filed on Dec. 13, 2017.

(51) Int. Cl.
*G06F 30/392* (2020.01)
*G06F 30/36* (2020.01)
*G06F 30/394* (2020.01)
*G06F 30/398* (2020.01)

(52) U.S. Cl.
CPC ............ *G06F 30/392* (2020.01); *G06F 30/36* (2020.01); *G06F 30/394* (2020.01); *G06F 30/398* (2020.01)

(58) Field of Classification Search
USPC ........................................................ 716/119
See application file for complete search history.

(56) References Cited

U.S. PATENT DOCUMENTS

| 8,910,100 | B1 * | 12/2014 | Wilson | G06F 17/5072 716/101 |
| 2007/0118825 | A1 * | 5/2007 | Gaul | G06F 17/5068 716/55 |
| 2011/0215420 | A1 * | 9/2011 | Hsueh | G06F 17/50 257/392 |
| 2014/0189625 | A1 * | 7/2014 | Huang | G06F 30/39 716/111 |

* cited by examiner

*Primary Examiner* — Eric D Lee
(74) *Attorney, Agent, or Firm* — Sterne, Kessler, Goldstein & Fox P.L.L.C.

(57) ABSTRACT

The present disclosure describes a method for replacing a device with a cell structure having a plurality of uni-gates. An exemplary method includes receiving a circuit diagram that includes the device, determining the cell structure wherein a cumulative effective gate length of the plurality of uni-gates is equal to a gate length of the device, generating, based on the cell structure and the device, a floor plan that includes an arrangement of a plurality of placeholders that match an arrangement of the cell structure and an arrangement of the device in the circuit diagram, and generating a circuit layout based on the floor plan, the cell structure, and the circuit diagram. The plurality of placeholders is replaced by the cell structure and the cell structure is connectable to other parts of the circuit diagram based on the circuit diagram.

20 Claims, 10 Drawing Sheets

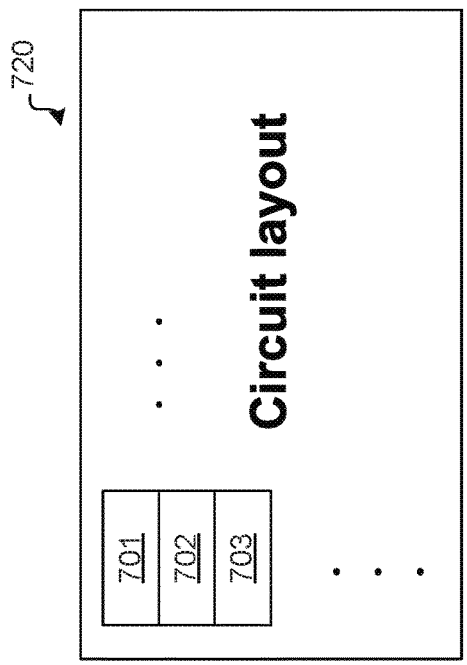
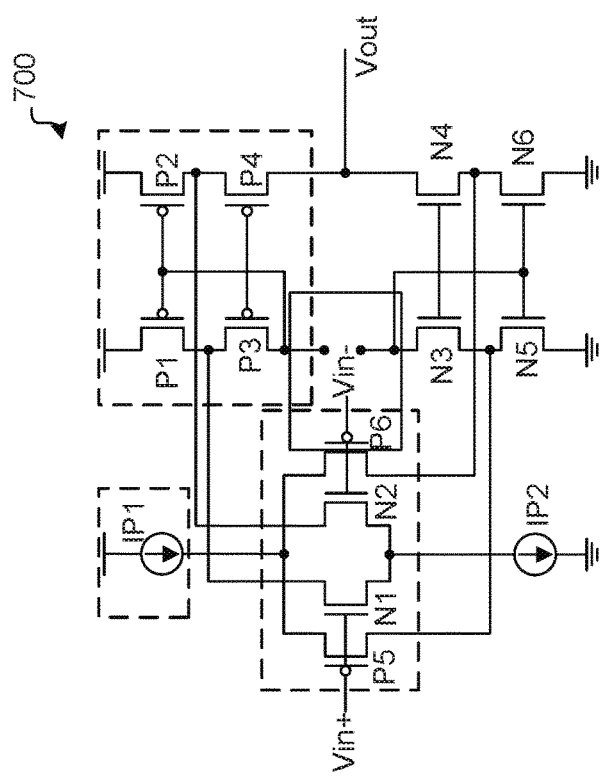
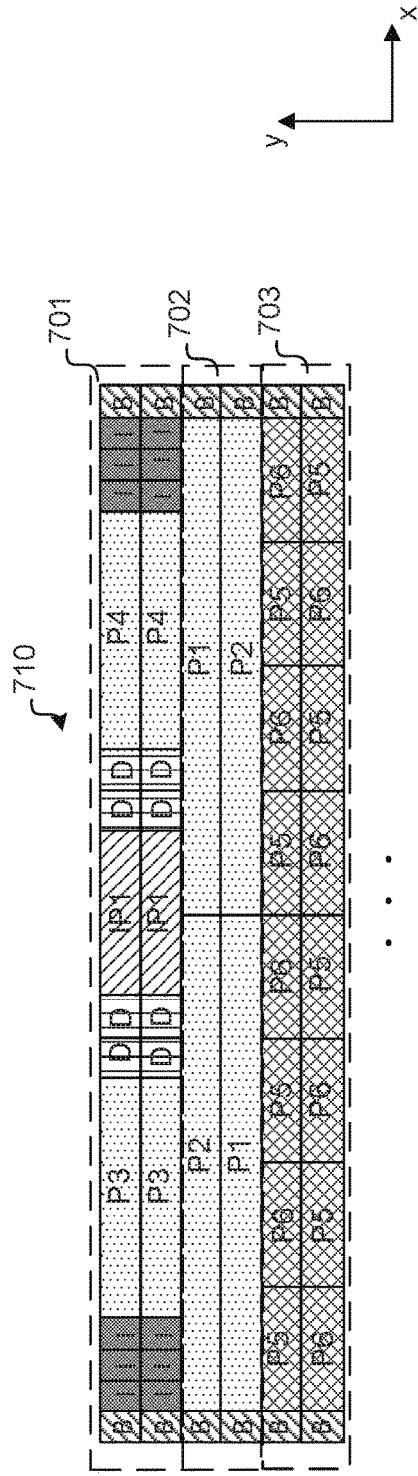
FIG. 7A
FIG. 7B
FIG. 7C

UNI-GATE CELL DESIGN

CROSS-REFERENCE TO RELATED APPLICATION

This application claims the benefit of U.S. Provisional Patent Application No. 62/598,304, titled "Uni-Gate Track-Based Analog Cell Design, Layout, and Routing Methodology" which was filed on Dec. 13, 2017 and is incorporated herein by reference in its entirety.

BACKGROUND

The semiconductor integrated circuit (IC) industry has experienced exponential growth. As ICs continue to scale down, more and more devices are integrated into a single chip. The performance of devices at one location (e.g., block) can be affected by devices at nearby locations (e.g., neighboring blocks) due to the compact arrangement of devices. Consequently, yield of the chip can be impaired, and the layout of the devices can cause inefficient use of area in the chip.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 7A-7C illustrate different operations of an exemplary process flow of uni-gate cell design, according to some embodiments.

DETAILED DESCRIPTION

Figure 1:
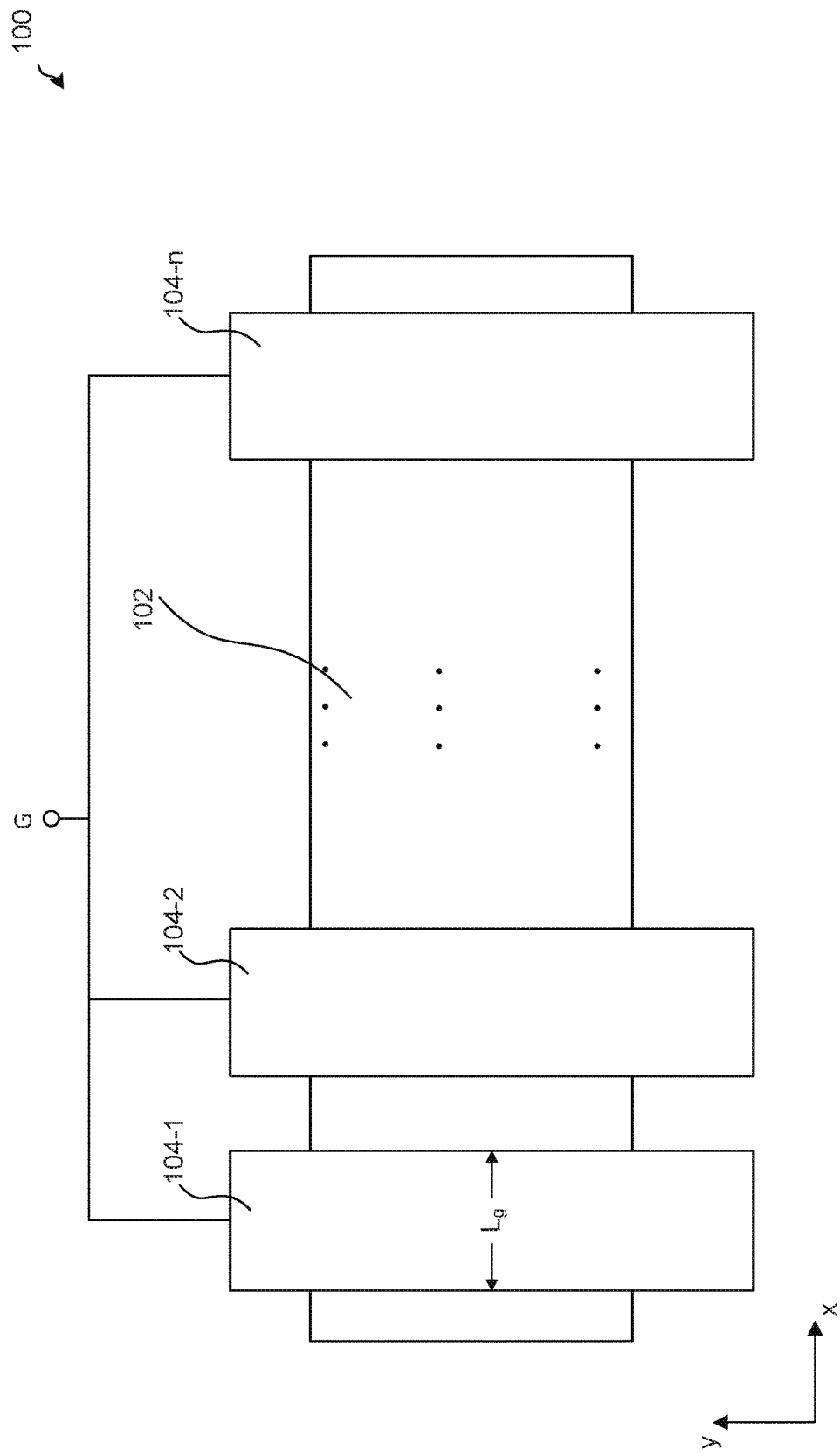
FIG. 1 illustrates a top layout view of an exemplary arrangement of uni-gates, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In semiconductor integrated circuit (IC) design, devices (e.g., transistors) in a chip are placed in different blocks to implement various functions. In advanced metal gate processes, to reduce gate threshold voltage mismatch and output impedance, transistors with long gate lengths can be used. Transistors with long gate lengths, arranged in an area (e.g., a block), can increase the metal gate density of the area. As the scaling down of semiconductor devices, more and more devices are integrated into a single chip. Accordingly, more transistors (e.g., having different gate lengths) are integrated into the blocks, and blocks with different metal gate densities are placed neighboring one another.

For example, the layout of a circuit can be determined based on the functions of the blocks, the physical locations of devices, the preference of a design engineer, and/or an electronic design automation (EDA) software tool. In an example, a digital block can be placed near (or adjacent to) an analog block in the same chip. The neighboring blocks/areas can have different metal gate densities, causing a density gradient effect (DGE) between the edges/boundaries of these blocks/areas. The DGE can cause the devices in these blocks/areas more susceptible to noise. Because the performance of the IC is at least partially dependent on pattern uniformity of the blocks/areas that include functional components, the DGE can impair the electrical functions of the transistors in these blocks. In another example, devices can be arbitrarily placed in a block/area, causing the placement of the devices (e.g., spacing between devices) susceptible to design rule violations. As a result, the yield of the chip can be impaired.

Embodiments of the present disclosure describe methods and structures for using cell structures that includes uni-gates (also referred to herein as "cell structures") to replace long-gate structures in devices (e.g., transistors, capacitors, and guard rings between different devices) in layout blocks. In the present disclosure, the term "uni-gates" refers to gates with the same/common gate length (also referred to as "uni-gate length"), and the term "long-gate structures" refers to structures/devices having gate lengths longer than the uni-gate length. According to some embodiments, the gate of a long-gate structure can be replaced by a cell structure that includes a plurality of uni-gates (e.g., with the same uni-gate length) stacked together, and the long-gate structures in a block can be replaced by a plurality of cell structures with the same or similar uni-gate lengths. Compared with blocks including long-gate structures, blocks including the cell structures of the same or similar uni-gate lengths are less susceptible to gate threshold voltage mismatch and have lower output impedance. Further, in a block, cell structures of opposite polarity types (e.g., N type and P type) and having the same uni-gate length and cell height can abut along the cell boundaries in an interleaving configuration) and be connected to one another with metal interconnects, reducing the layout area. Devices including uni-gates of the same uni-gate length and cell height can be abutted with less transitional cells (e.g., non-active cells placed between devices for various functions such as protection and leakage reduction), further reducing the layout area.

Further, because neighboring blocks can include cell structures with the same or similar uni-gate lengths, metal gate densities of the blocks can be more uniform, and the DGE between neighboring blocks can be reduced or prevented. A higher yield of the IC can be obtained. Also, the arrangement of metal interconnects in and between the cell structures can be optimized to satisfy electro-migration (EM) criteria of the IC, and the arrangement of the parts in the cell structures (e.g., uni-gates and metal interconnects) can be optimized to comply with design rules. Accordingly, a block formed by a plurality of cell structures is more likely to pass design-rule check (DRC) and satisfy EM criteria. The design efficiency of the IC can thus be increased (e.g., increased by up to about 200%).

Further, because the cell structures can be defined and stored in the library to replace devices/structures of different gate lengths, the number of uni-gates included in a cell structure and/or the uni-gate length of the cell structure can be flexibly defined for different application and design requirements. By changing the cell structures (e.g., uni-gate length of the cell structures) defined in the library, the cell structures in the blocks/circuit can be changed/updated automatically. For example, when the defined cell structures have a uni-gate length associated with a particular technology node and the technology node transitions to a smaller feature size (e.g. from 7 nm to 6 nm), the uni-gate length in a cell structure can be changed/updated accordingly. Thus, a new circuit layout does not need to be developed when the technology node changes, thus reducing IC manufacturing costs.

FIG. 1 illustrates a top layout view of an exemplary arrangement 100 of uni-gates, according to some embodiments. In some embodiments, arrangement 100 includes a plurality of uni-gates (e.g., 104-1, 104-2, . . . , 104-n, n being a positive integer) aligned along a first direction (e.g., the x-direction or the horizontal direction) and extending along a second direction (e.g., the y-direction or the vertical direction) over an active region 102, sharing a same gate connection G. In the present disclosure, n represents the number of uni-gates in a cell structure. The source/drain regions of the uni-gates can be connected in series such that the cumulative effective gate length of the connected uni-gates can be equal to a long-gate structure that has a gate length of the sum of the total uni-gate lengths. In some embodiments, active region 102 can be doped and/or include diffusion structures that can form the source and/or drain (e.g., S/D) regions of the uni-gates. In some embodiments, active region 102 includes a plurality of fins (not shown) aligned along a second direction (e.g., the y-direction or the vertical direction). The first direction can be different from the second direction. In some embodiments, the first direction is perpendicular to the second direction.

As shown in FIG. 1, each uni-gate (104-1, . . . , 104-n) of arrangement 100 can have a same gate length (e.g., uni-gate length) of Lg along the first direction, and the cumulative effective gate length of the uni-gates can be equal to the gate length of n·Lg. In some embodiments, arrangement 100 is referred to as a "stacking gate" arrangement/configuration and can be formed in a cell structure to replace a long-gate structure that has a gate length equal to n·Lg. The value of n can be determined flexibly, depending on the design and application requirements. The stacking gate structure, formed by uni-gates of smaller uni-gate length Lg, can reduce gate threshold voltage mismatch and output impedance of the structure/device that includes the stacking gate structure. For example, a device with a gate length of 60 nm can be replaced by a cell structure including 6 uni-gates, each having a uni-gate length of 10 nm, connected in series along the first direction. In some embodiments, uni-gate length Lg can represent the smallest technology node.

Figure 2:
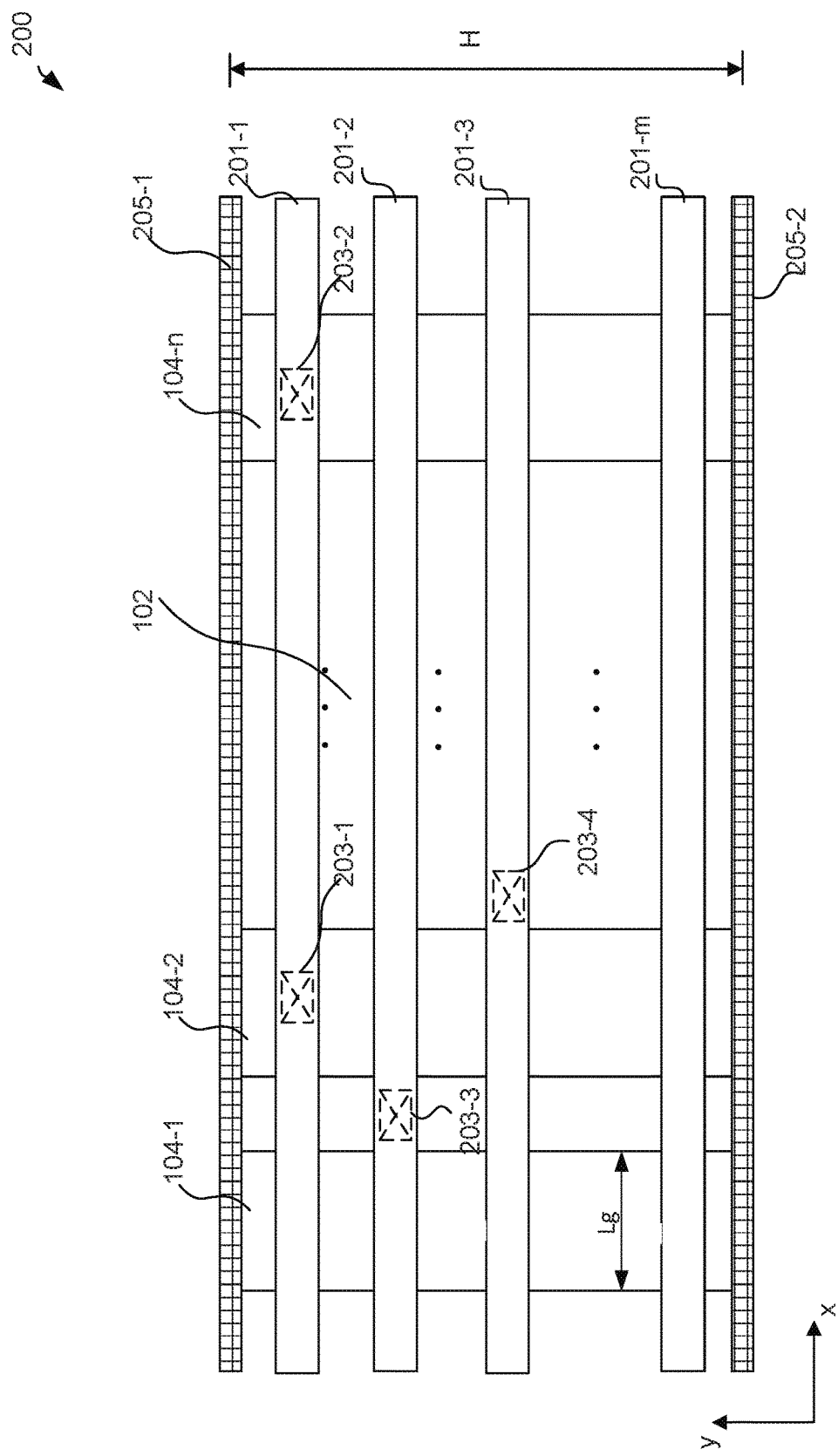
FIG. 2 illustrates a top layout view of a cell structure based on the uni-gates of FIG. 1, according to some embodiments.

FIG. 2 illustrates a layout view of a cell structure 200 based on the arrangement of uni-gates shown in FIG. 1, according to some embodiments. Compared with arrangement 100, cell structure 200 illustrated in FIG. 2 can include two separation structures 205-1 and 205-2, and a plurality of metal interconnects M0 (e.g., 201-1, 201-2, . . . , 201-m, m being a positive integer). Separation structures 205-1 and 205-2 can include any suitable material that is different from uni-gates (e.g., 104-1, . . . , 104-n) and active region 102. In an example, separation structures 205-1 and 205-2 can be formed, e.g., by removing conductive materials at the boundaries of cell structure 200 and filling the removed portions of the boundaries with a suitable insulating material, to separate adjacent cell structures 200. In some embodiments, separation structures 205-1 and 205-2 include electrically-insulating structures and are placed at two ends of the uni-structure along the second direction to insulate/disconnect the uni-gates of cell structure 200 from other parts of the circuit layout along the second direction separation structures 205-1 and 205-2 can define the boundaries of cell structure 200 along the second direction. The length of a separation structure along the second direction can be optimized to provide sufficient isolation between cell structure 200 and external devices/structures, and the placement of cell structure 200 is less susceptible to design rule violations. A plurality of metal interconnects M0 (e.g., 201-1, 201-2, . . . , 201-m) can extend along the first direction and aligned along the second direction. The arrangement of metal interconnects M0 (e.g., the positions of metal interconnects M0 and distance between adjacent metal interconnects M0) can be optimized so that the electrical connection formed based on the metal interconnects M0 (e.g., between the metal interconnects M0 and other parts of cell structure 200) is less susceptible to violations of the design rules and criteria.

FIG. 2 shows exemplary contact vias (shown as dashed lines) for connecting metal interconnects M0 and the underlying structures. For example, 203-1 and 203-2 can be the contact vias between metal interconnect 201-1 and uni-gates 104-2 and 104-n, respectively; 203-3 can be a contact via between metal interconnect 201-2 and the source region; and 203-4 can be a contact via between metal interconnect 201-3 and the drain region. When replacing a long-gate structure using cell structure 200, the actual positions and/or number of contact vias can be determined based on different applications and/or design requirements.

A cell height of cell structure 200 can be defined as the distance H between the mid-lines (the lines substantially aligned along the middle position of a structure and extending along the first direction) of separation structures 205-1 and 205-2 along the second direction. Cell height H of cell structure 200 can be associated with the width of active region 102 along the second direction. In some embodiments, in finFETs, the value of H can be associated with the number of fins that can be formed in active region 102, and can be referred to as "nfin."

In some embodiments, one or more long-gate structures in a layout block are replaced by cell structures 200, and the number of uni-gates in different cell structures 200 can be the same or different. In some embodiments, long-gate structures in the same layout block are replaced with cell structures 200 of the same uni-gate length. In some embodiments, long-gate structures in different layout blocks are replaced with cell structures 200 of the same or different uni-gate lengths. In some embodiments, long-gate structures in neighboring (e.g., adjacent) layout blocks are replaced with cell structures 200 of the same or similar uni-gate lengths. For example, the uni-gate lengths of cell structures 200 in two adjacent layout blocks can be sufficiently close (e.g., variation below 5 nm) or the same.

In some embodiments, cell structure 200 can be defined in a cell library of an electronic design automation (EDA) tool. The cell library can include one or more cell structures 200, each having a different number n of uni-gates 104-*n* connected in series along the first direction. Cell structures 200 with different numbers of uni-gates 104 can be used to replace long-gate structures of different gate lengths. Cell structure 200 can be N-type or P-type. In some embodiments, because the arrangement (e.g., placement and locations, spacing between structures, lengths, and/or widths) of uni-gates 104, metal interconnects M0 201, and separation structures 205 are optimized, the structures/devices replaced by cell structures 200 are less susceptible to violations of design rules and EM criteria. The circuit layout after the replacement using cell structures 200 can have a higher yield, a reduced gate threshold voltage mismatch, and a reduced output impedance.

In some embodiments, cell structure 200 of the same uni-gate length Lg and having a cumulative gate length n·Lg and cell height H can be used to replace a long-gate structure that has a cell height of H and a gate length of n·Lg. For example, cell structure 200 can have a cell height of 160 nm and can include 6 uni-gates, each having a gate length of 10 nm, connected in series. Cell structure 200 can replace a device/structure having a gate length of 60 nm and a cell height of 160 nm in a circuit layout. In some embodiments, cell structures 200 of the same uni-gate length Lg and cell height H having the same or different number n of uni-gates are connected in series for replacement of a long-gate structure that has a gate length of the sum of all connected uni-gates and a cell height of H. In some embodiments, cell structures 200 of the same uni-gate length Lg and the same number n of uni-gates are connected in parallel (e.g., forming a "multi-finger" configuration) for replacement of a long-gate structure that has a gate length of n·Lg and a greater cell height. In an example, 3 cell structures 200, each having 5 uni-gate length Lg of 10 nm and a cell height of 250 nm, can be connected in series to form a structure that has an effective cumulative gate length of 150 nm and a cell height of 250 nm. In another example, these cell structures 200 can be connected in parallel to form a structure that has an effective cumulative gate length of 50 nm and cell height of 750 nm. In the present disclosure, when the source/drain regions of two cell structures 200 are connected in series, the two cell structures 200 are connected in series; and when the source/drain of two cell structures 200 are connected in parallel, the two cell structures 200 are connected in parallel. The connected cell structures can be defined in the cell library or be formed in a circuit layout. Thus, cell structures 200 can be connected to replace long-gate structures of extended gate length and/or cell height.

In some embodiments, cell structures 200 can be used to replace structures/devices in the same block or different blocks of a circuit layout. For example, for two neighboring blocks, at least devices close to the boundaries can be replaced by cell structures of same or similar uni-gate lengths. For example, devices at the boundaries of two neighboring blocks can be replaced by cell structures 200 with uni-gate lengths of 10 nm and 12 nm, respectively. In another example, devices of two adjacent blocks can be both replaced with cell structures 200 with uni-gate length of 10 nm. The choices of values of uni-gate lengths and cell heights, and the devices to be replaced can depend on the application and/or design rules and should not be limited by the embodiments of the present disclosure.

In some embodiments, cell structures defined in the cell library can include active cell structures and non-active cell structures. Active cell structures can refer to the cell structures for replacement of active components (e.g., transistors and capacitors) in a circuit layout. Non-active cell structures can refer to the cell structures for replacement of non-active components or transitional components (e.g., guard ring devices and dummy/auxiliary devices) in a circuit layout. In an exemplary operation, a device, including the active component and the associated non-active components, can be replaced by a plurality of active cell structures and a plurality of non-active cell structures of the same or similar uni-gate lengths. In some embodiments, adjacent devices can be replaced by active cell structures and non-active cell structures of the same or similar uni-gate lengths.

For example, the cell library can include a plurality of active cell structures for replacement of active components (e.g., transistors), a plurality of P-type and N-type guard ring cell structures for replacement of guard ring devices, and a plurality of P-type and N-type dummy/auxiliary cell structures for replacement of dummy/auxiliary devices. The guard ring cell structures can reduce leakage current and isolate the associated active cell structures from noise. The dummy/auxiliary cell structures can be electrically floating and can protect the associated active cell structures and/or change the gate electrode density of a certain area. Guard ring cell structures and dummy/auxiliary cell structures, and the associated active cell structures, can include uni-gates of the same uni-gate lengths. When replacing a long-gate structure in a circuit layout, active cell structures and the associated non-active cell structures of the same or similar uni-gate lengths can be selected together (e.g., as a package) Accordingly, because the active cell structures and the non-active cell structures comply with the design rules, the structure formed after the replacement is less susceptible to design rule violations.

In some embodiments, the guard ring cell structures can further include a plurality inner guard ring cell structures and a plurality of boundary guard ring cell structures. The inner guard ring cell structures can directly surround and abut the active cell structures. The boundary guard ring cell structures can surround and abut the inner guard ring cell structures and/or the active cell structures to isolate/separate the active cell structures from external structures/devices. The boundary guard ring cell structures can include horizontal guard ring cell structures (e.g., aligned along the first direction), vertical guard ring cell structures (e.g., aligned along the second direction), and corner guard ring cell structures (e.g., located at a corner that horizontal guard ring cell structures and vertical guard ring cell structures intersect). The dimensions of the guard ring cell structures can be based on the dimensions of associated active cell structures so that the active cell structures and the associated guard ring cell structures can abut one another properly and compactly. In some embodiments, the dimension of an inner guard ring cell structure is smaller than the dimensions of associated boundary guard ring cell structures.

FIGS. 3A-3D each illustrates an exemplary arrangement of cell structures, according to some embodiments. Cell structures shown in FIGS. 3A-3D, e.g., 301-1, ..., 301-4, 304-1, ..., 304-3, 306-1, 306-2, 307-1, 307-2, 308, 309, 314-1, 322-2, can each be similar to or the same as the cell structure illustrated in FIG. 2. These cell structures can represent any suitable devices/structures such as metal-oxide semiconductor field effect transistors (MOSFETs), capacitors, bipolar junction transistors, etc. FIGS. 3A-3D also illustrate exemplary abutment arrangements between different cell structures in a circuit layout.

Figure 3A:
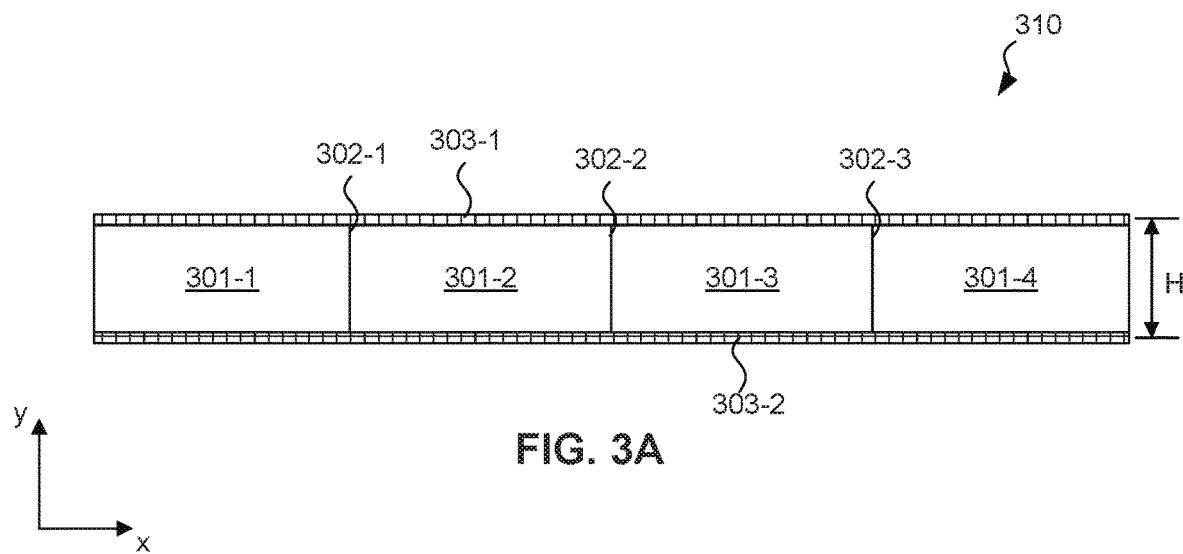
FIGS. 3A-3D illustrate exemplary arrangement of cell structures, according to some embodiments.

FIG. 3A illustrates a structure 310 formed by a plurality of cell structures abutting one another along the first direction (e.g., x-direction or horizontal direction), according to some embodiments. For example, cell structures 301-1, . . . , 301-4 can be cell structures that have the same uni-gate length and same polarity type (e.g., P type or N type). Cell structures 301-1, . . . , 301-4 can be electrically connected through metal interconnects M0 along the first direction and can be insulated/separated from other structures by separation structures 303-1 and 303-2 along the second direction (e.g., y-direction or vertical direction). Cell structures 301-1, . . . , 301-4 can abut one another at the vertical boundaries (e.g., 302-1, . . . , 301-4). The electrical connection between the two cell structures can be formed by connecting suitable metal interconnects M0 (e.g., metal interconnects M0 that connect the uni-gates of a cell structure) of the two cell structures. In some embodiments, cell structures 301-1 and 301-3 include a first number of uni-gates that have a same gate length of Lg, and cell structures 301-2 and 301-4 include a second number of uni-gates that have the same gate length Lg. The first number can be the same as or different from the second number. When the first number is different from the second number, the arrangement of cell structures, as shown in FIG. 3A is referred to as an "interleaving arrangement." In some embodiments, the interleaving arrangement can reduce the DGE and gate threshold voltage mismatch compared to a non-interleaving arrangement.

Figure 3B:
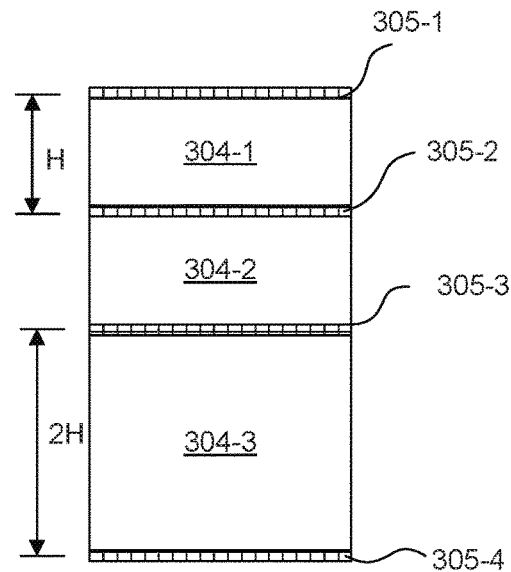

FIG. 3B illustrates a structure 320 formed by a plurality of cell structures abutting along the second direction, according to some embodiments. Cell structures having the uni-gates of the same uni-gate length Lg can abut one another along the second direction and be separated/isolated by separation structures. Cell structures abutting along the second direction (e.g., 304-1, 304-2, and 304-3) can each be a N-type or a P-type structure/device, and adjacent cell structures can be of the same polarity type (e.g., N-N abutment or P-P abutment) or of different polarity types (e.g., N-P abutment). As shown in FIG. 3B, adjacent cell structures can be separated/insulated from one another by a separation structure (e.g., 305-1, . . . , 305-4). Electrical connection among the cell structures along the second direction can be formed by metal interconnects M1 (not shown) aligned along the second direction. In some embodiments, cell structures abutting along the second direction can be the same device type (e.g., MOSFETs, BJTs, or capacitors) with the same number of uni-gates and the same uni-gate length Lg. In some embodiments, cell structures abutting along the second direction can have the same cell height (e.g., cell height H). For example, cell structure 304-1 can be an NMOS with uni-gate length of 10 nm and a gate height of 200 nm, and cell structure 304-2 can be a PMOS with uni-gate length of 10 nm and a gate height of 200 nm. In some embodiments, cell structure 304-2 can be formed by flipping cell structure 304-1 along the second direction. In some embodiments, cell structures abutting along the second direction can have different cell heights. In some embodiments, the cell height of cell structure 304-3 is 2H and the cell height of each of cell structures 304-1 and 304-2 is H.

Figure 3C:
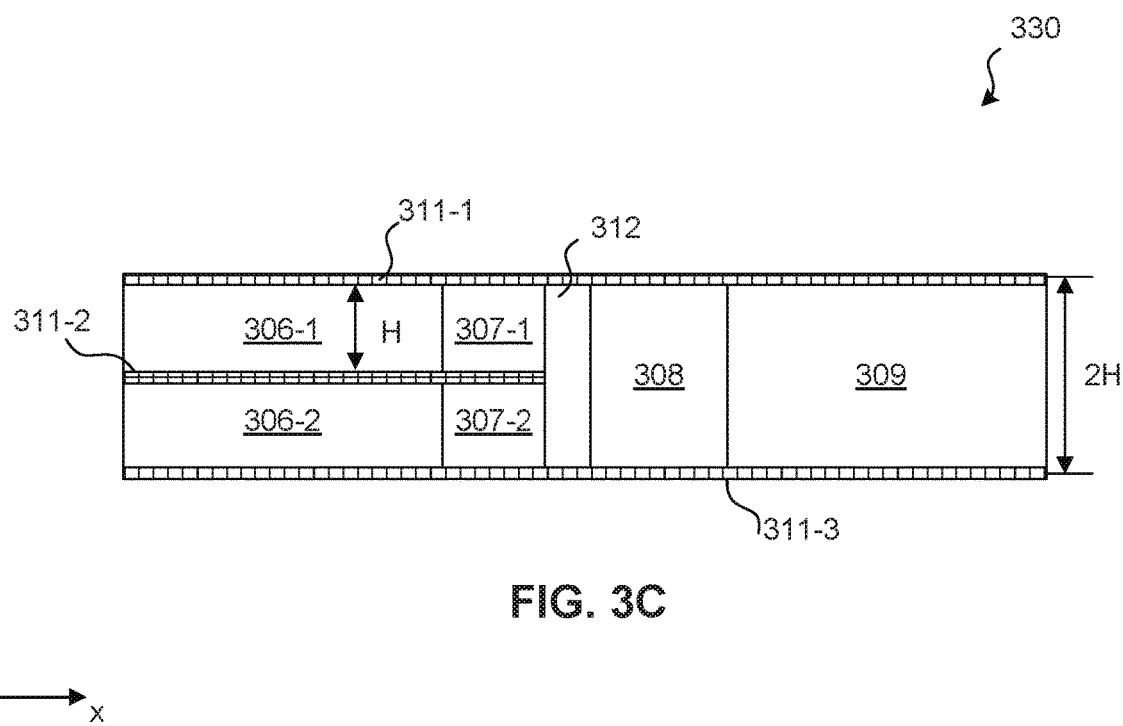

FIG. 3C illustrates a structure 330 formed by cell structures of different cell heights abutting along the first direction, according to some embodiments. As shown in FIG. 3C, cell structures 306-1, 306-2, and 309 can each include the same number n of uni-gates of uni-gate length Lg. Cell structures 306-1 and 306-2 can have a cell height of H, and cell structure 309 can have a cell height of 2H. Cell structures 306-1 and 306-2 can be separated/isolated by separation structure 311-2, and structure 330 can be separated/isolated from other structures along the second direction by separation structures 311-1 and 311-3. Cell structures 306-1, 306-2, and 309 can each include active cell structures of the same polarity type. In some embodiments, cell 306-2 is formed by flipping cell 306-1 along the second direction. Cell structures 307-1, 307-2, and 308 can each include a non-active cell structure that has the same uni-gate length Lg. In some embodiments, cell structures 307-1 and 307-2 each has a cell height of H, and cell structure 308 has a cell height of 2H. For example, cell structures 307-1 and 307-2 can each be an inner guard cell structure for cell structures 306-1 and 306-2, and cell structure 308 can be an inner guard ring structure for cell structure 309. In some embodiments, an auxiliary/dummy uni-gate 312 formed on an insulating structure (e.g., a shallow trench isolation (STI) structure) can be formed between the inner guard ring cell structures 307-1/307-2 and 308 to further isolate cell structures 306-1/306-2 and 309. That is, two cell structures of cell height H can be stacked vertically and abut a cell structure of cell height 2H horizontally, with inner guard ring cell structures and/or a dummy uni-gate in between. In some embodiments, no boundary guard ring cell structures need to be placed to surround the inner guard ring cell structures. Accordingly, less guard ring cell structures are placed in the arrangement shown in FIG. 3C. Further, because a boundary guard ring cell structure can have greater dimensions than an inner guard ring cell structure, the layout area for horizontal abutment of cell structures with cell structures of twice the cell height, as shown in FIG. 3C, can further be reduced.

Figure 3D:
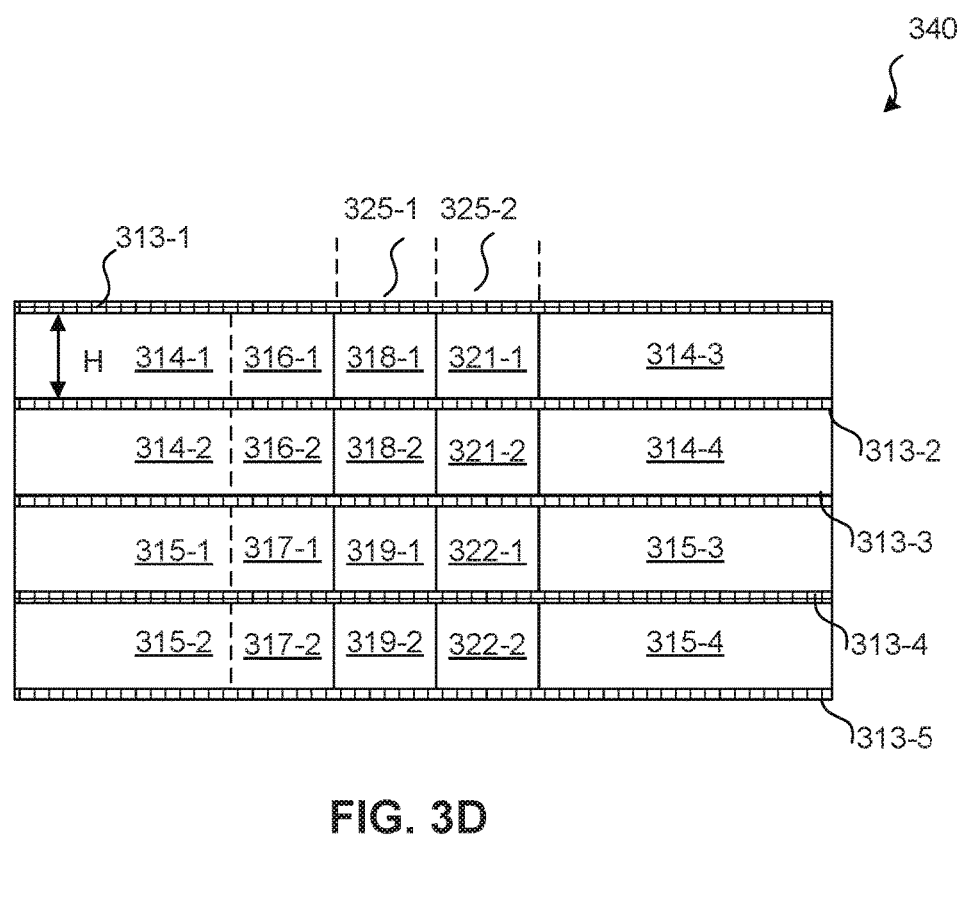

FIG. 3D illustrates a structure 340 formed by cell structures of opposite polarity types abutting along the first direction and the second direction, according to some embodiments. In some embodiments, 314-1, 314-2, 314-3, and 314-4 are active cell structures of a first polarity type; 315-1, 315-2, 315-3, and 315-4 are active cell structures of a second polarity type; 318-1, 318-2, 321-1, and 321-2 are inactive cell structures of the first polarity type; and 319-1, 319-2, 322-1, and 322-2 are inactive cell structures of the second polarity type. The first polarity type can be different from the second polarity type. Cell structure 316 can be a portion of active cell structure 314 and can be doped with dopants of the second type, and cell structure 317 can be a portion of active cell structure 315 and can be doped with dopants of the first type. In some embodiments, structure 340 can repeat along the second direction. For example, active cell structure 315-2 (e.g., and/or 315-4) can abut another active cell structure similar to or the same as active cell structure 314-1 (e.g., and/or 314-3) along the second direction. Cell structures 313-1 and 313-5 can be separation structures for separating/isolating the cell structures from other structures/devices along the second direction, and 313-2, 313-3, and 313-4 can be separation structures for separating/isolating cell structures within structure 340.

In some embodiments, 314-1, 314-2, 314-3, and 314-4 are PMOSFETs; 315-1, 315-2, 315-3, and 315-4 are NMOSTETs; 318-1 and 318-2 are P-type dummy cell structures; 321-1 and 321-2 are P-type inner guard ring cell structures; 319-1 and 319-2 are N-type inner guard ring structures; 322-1 and 322-2 are N-type inner guard ring structures; 316-1 and 316-2 are N-type wells (Nwells); and 317-1 and 317-2 are portions of the P-type substrate (Psub). As shown in FIG. 3D, along the second direction, active cell structures (314-1, 314-2, 315-1, and 315-2) of the same polarity type and of different polarity types can abut (e.g., in PP-NN arrangement), with separation structures (e.g., 313-2, 313-3, and 313-4) placed between two active cell structures along the second direction. Along the first direction, when an Nwell (e.g., 316-1) is included in a first PMOSFET (e.g., 314-1), a P-type dummy cell (e.g., 318-1) can abut the Nwell and a P-type inner guard ring cell structure (e.g., 321-1) can abut the P-type dummy cell and the second PMOSFET (e.g., 314-3), as shown in FIG. 3D. Further, when a Psub (e.g., 317-1) is included in a first NMOS (e.g., 315-1), an N-type inner guard ring cell structure (e.g., 319-1) can abut the Psub and an N-type dummy cell (e.g., 322-1) can abut the N-type inner guard ring cell structure and the second NMOSFET (e.g., 315-3). Thus, P-type dummy cell structures 318-1 and 318-2 and N-type inner guard ring cell structures 319-1 and 319-2 can align along the second direction in column 325-1, and P-type inner guard ring cell structures 321-1 and 321-2 and N-type dummy cell structures 322-1 and 322-2 can align along the second direction in column 325-2.

Structure 340 can repeat/replicate along the second direction and more PMOS and NMOS can abut along the second direction to form the PP-NN-PP-NN . . . arrangement. Structure 340 can also repeat/replicate along the first direction, and two columns of dummy cell structures and inner guard ring cell structures can be formed between a well/portion of the substrate and a MOSFET of an opposite polarity type. According to the arrangement, no additional guard ring cell structures need to be formed between structures/devices along the second direction, and no additional boundary guard ring cell structures need to be formed between a well/portion of the substrate and a MOSFET of an opposite polarity type. The layout area for placing MOSFET devices of opposite polarity types can be reduced.

Figure 4:
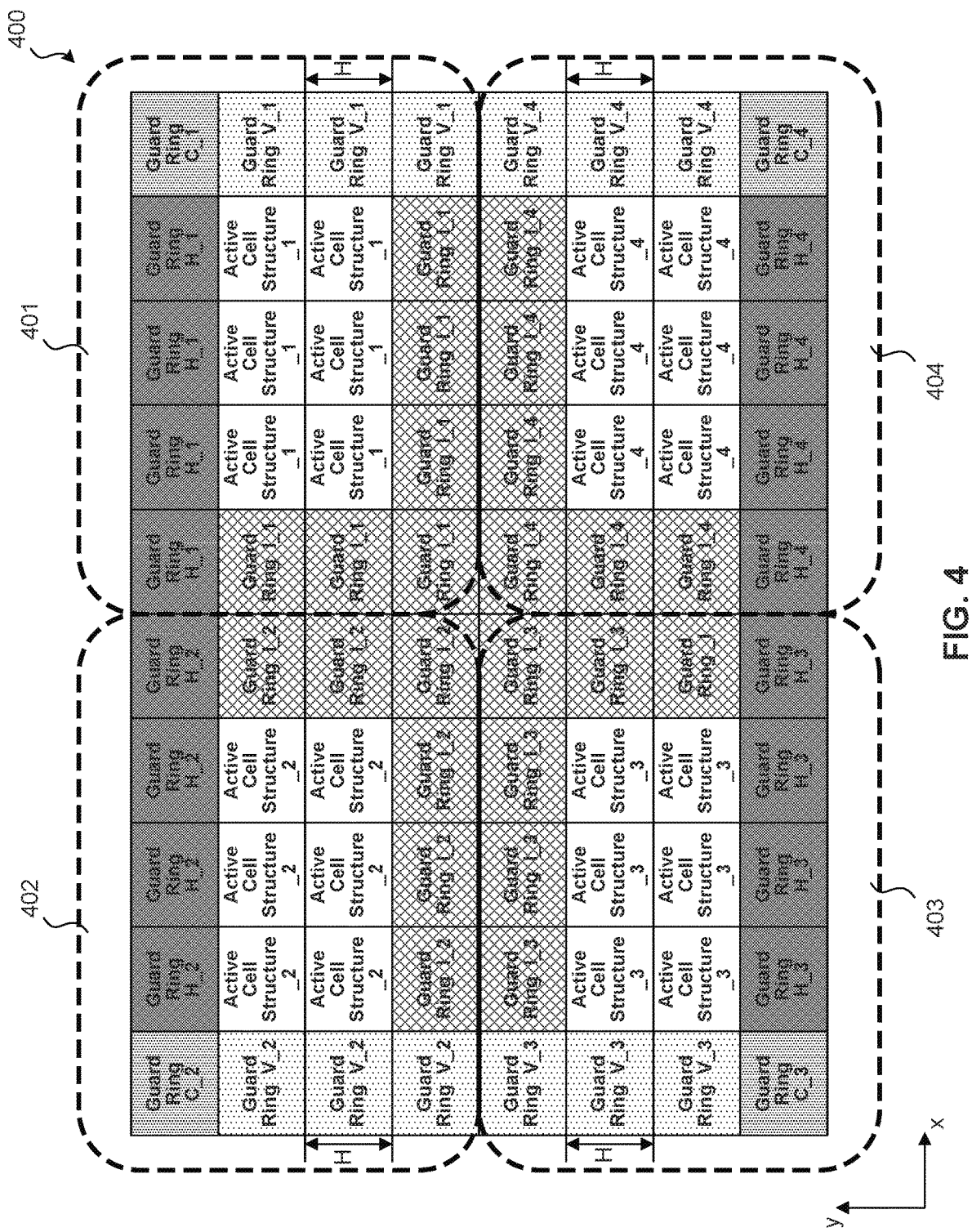
FIG. 4 illustrates an exemplary arrangement of layout blocks, according to some embodiments.

FIG. 4 illustrates an exemplary arrangement 400 of four blocks 401, 402, 403, and 404 abutting one another, according to some embodiments. Each block can have a plurality of active cell structures surrounded by a plurality of non-active cell structures (e.g., guard ring cell structures). An active cell structure is labeled as "active cell structure_k" (k=1, 2, 3, and 4); an inner guard ring cell structure is labeled as "guard ring I_k;" a horizontal guard ring cell structure is labeled as "guard ring H_k;" a vertical guard ring cell structure is labeled as "guard ring V_k;" and a corner guard ring cell structure is labeled as "guard ring C_k." Boundary guard ring cell structures (e.g., horizontal guard ring cell structures, vertical guard ring structures, and corner guard ring structures) can surround inner guard ring cell structures and active cell structures to protect/isolate them from external circuit/devices.

In some embodiments, each of the four blocks 401-404 can be formed from active cell structures and guard ring cell structures of the same uni-gate length Lg. The active cell structures can have the same cell height H. Blocks 401-404 can include active cell structures of the same device type, e.g., MOSFETs. For example, block 401 includes 6 active cell structures (e.g., represented by "cell structure_1"), surrounded by 6 inner guard ring cell structures (e.g., represented by "guard ring I_1"), 4 horizontal guard ring cell structures (e.g., represented by "guard ring H_1"), 1 corner guard ring cell structure (e.g., represented by "guard ring C_1"), and three vertical guard ring cell structures (e.g., represented by "guard ring V_1"). The guard ring cell structures can protect the surrounded active cell structures and suppress leakage current between the surrounded active cell structures and the external circuit. The functions of the guard ring cell structures are described above. The dimensions of the inner guard ring cell structures can be designed to match the dimensions of the active cell structures being surrounded, and the dimensions of the vertical guard ring structures, the horizontal guard ring structures, and the corner guard ring structures can be designed to match the dimensions of the contact sides of the inner guard ring cell structures and/or the active cell structures. In some embodiments, the dimensions of the active cell structures, the inner guard ring cell structures, and the boundary guard ring cell structures are optimized to comply with design rules.

Based on embodiments of the present disclosure, adjacent blocks can abut one another through inner guard ring cell structures (e.g., guard rings I_2 abutting with guard rings I_1, guard rings I_4 abutting with guarding rings I_1, guard rings I_3 abutting with guard rings I_4, and guard rings I_2 abutting with guard rings I_3). In some embodiments, horizontal guard ring cell structures, vertical guard ring cell structures, or corner guard ring cell structures do not need to be formed between adjacent blocks, and less layout area is needed for placement of blocks 401-404. Further, because the cell structures that form blocks 401-404 comply with design rules, arrangement 400 is more likely to pass the DRC. The efficiency of the IC design can thus be improved.

Figure 5:
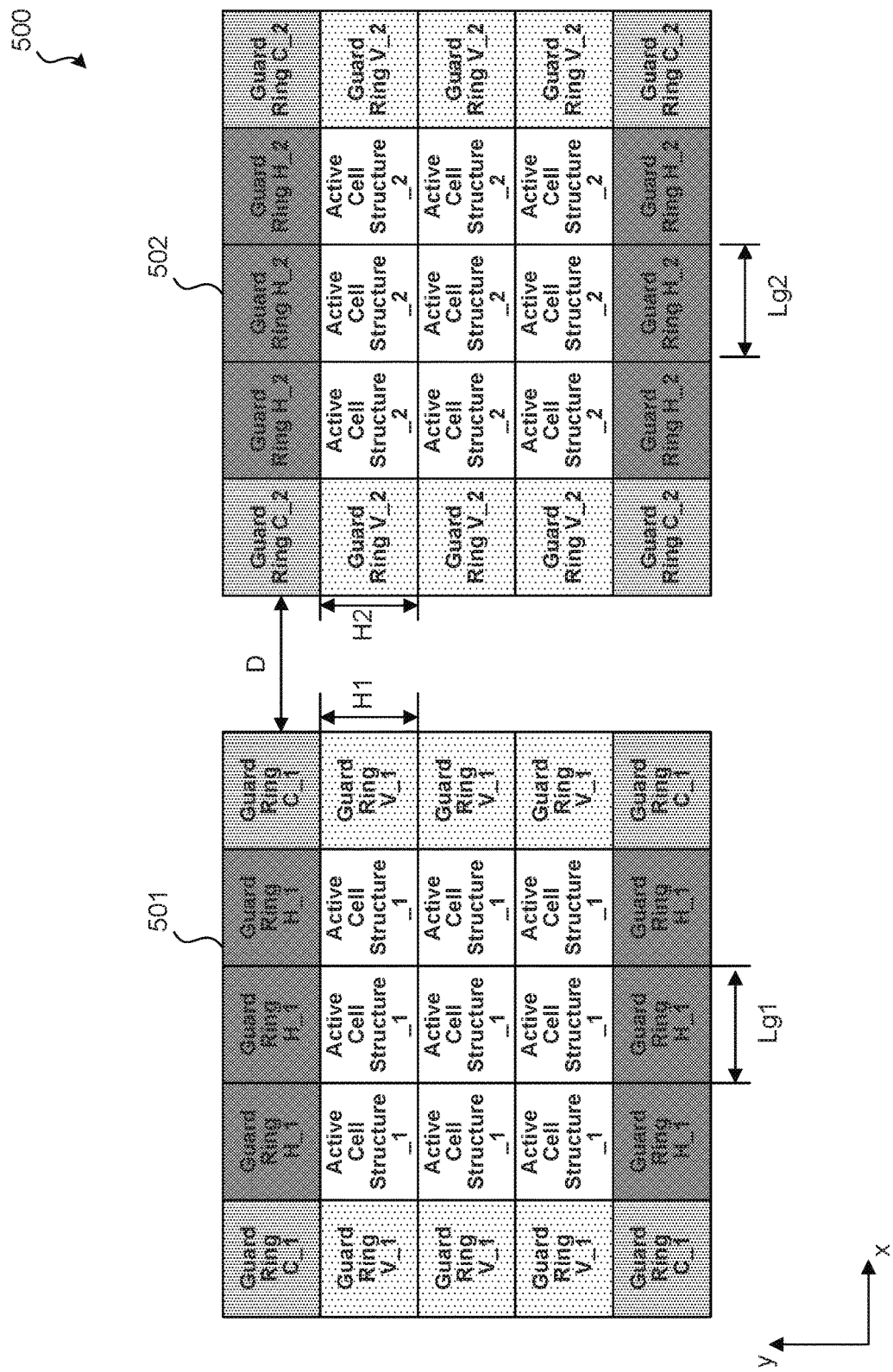
FIG. 5 illustrates another exemplary arrangement of layout blocks, according to some embodiments.

FIG. 5 illustrates another exemplary arrangement 500 of blocks 501 and 502 placed in a same block, according to some embodiments. Different from the blocks 401-404 shown in FIG. 4, blocks 501 and 502 can respectively be formed by cell structures of different uni-gate lengths, different cell heights, and/or different device types. In some embodiments, blocks 501 and 502 can be separated by a minimum distance/spacing D of about 100 nm to about 300 nm to comply with design rules. In some embodiments, D is about 200 nm. In some embodiments, boundary guard ring cell structures are formed to surround the active cell structures in blocks 501 and 502. In some embodiments, the active cell structures abut boundary guard ring cell structures, as shown in FIG. 5.

For example, block 501 can include cell structures (e.g., including active cell structures and guard ring cell structures) of uni-gate lengths Lg1 and cell height H1, and block 502 can include cell structures of uni-gate lengths Lg2 and cell height H2. For illustration purposes, Lg1 and Lg2 are labeled in blocks 501 and 502, respectively. The labeling of Lg1 and Lg2 are merely for distinguishing the two uni-gate lengths and are not intended to indicate the actual dimensions of the cell structures or actual value of the uni-gate lengths. In some embodiments, H1 is different from H2, and/or Lg1 is different from Lg2. Within each of blocks 501 and 502, active cell structures (active cell structure_1 and active cell structure_2) can be surrounded by horizontal guard ring cell structures (guard ring cell structures H_1 and guard ring cell structures H_2) along the first direction, by vertical guard ring cell structures (guard ring cell structures V_1 and guard ring cell structures V_2) along the second direction, and by corner guard ring cell structures (guard ring cell structures C_1 and guard ring cell structures C_2) at the corners. In some embodiments, even with the minimum distance D, the total layout area to form blocks 501 and 502 is smaller than without the cell structure replacement. Using arrangement 500, the total area to form blocks 501 and 502 can be reduced.

Figure 6:
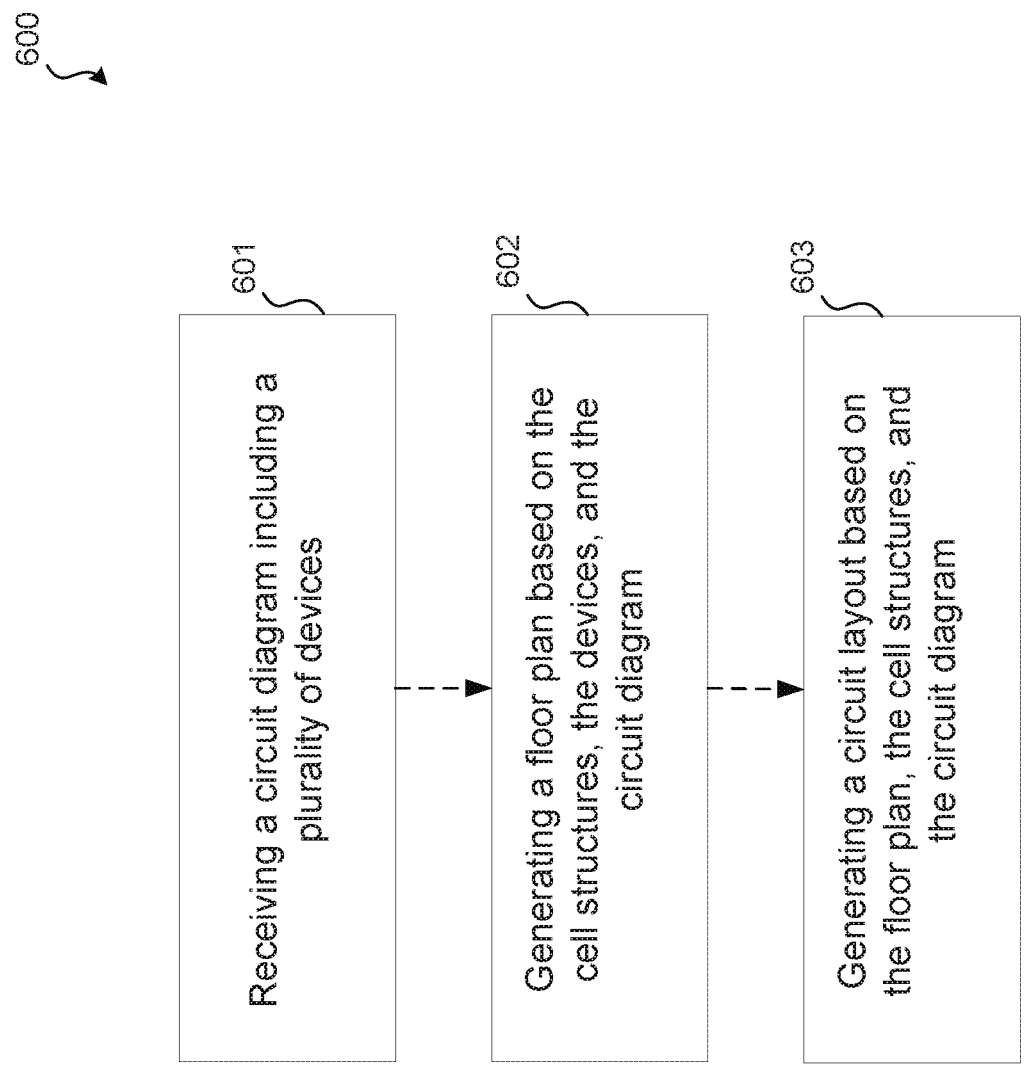
FIG. 6 illustrates an exemplary process flow of replacement of long-gate structures using the disclosed cell structures, according to some embodiments.

FIG. 6 illustrates an exemplary process flow 600 of uni-gate cell design, and FIG. 7 illustrates different operations in the exemplary process flow, according to some embodiments. In some embodiments, operations of process 600 can be performed in a different order. Variations in the operations of process 600 are within the scope of the present disclosure.

At operation 601, a circuit diagram including a plurality of devices are received by, for example, a circuit schematic tool. In some embodiments, the circuit schematic tool can be an EDA tool, which includes a cell library. The circuit diagram can include any suitable devices/structures that have a gate structure and a gate length. FIG. 7A illustrates an exemplary circuit diagram 700 that includes a plurality of P-type MOSFETs (e.g., P1-P6), a plurality of N-type MOSFETs (e.g., N1-N6), and current sources (e.g., IP1 and IP2). The MOSFETs can have the same or different gate lengths. The cell library can include a plurality of cell structures as illustrated in FIG. 2. The plurality of cell structures can each include uni-gates of a different uni-gate length. The plurality of cell structures can include active cell structures and non-active cell structures of different uni-gate lengths. In some embodiments, the cell library includes an active cell structure of a uni-gate length and one or more non-active cell structures of the same uni-gate length. In some embodiments, the cell library includes a plurality of cell structures of the same uni-gate length Lg and different n numbers so that the cell structures can have different cumulative effective uni-gate lengths. In some embodiments, the cell library includes cell structures of cumulative effective uni-gate lengths equal to the gate lengths of the MOSFETs shown in FIG. 7A.

In some embodiments, the cell structures of which the total effective gate lengths are equal to the gate lengths of the plurality of devices are determined, e.g., by the EDA tool. The total effective gate length of the cell structures can be the sum or cumulative effective uni-gate lengths of these cell structures.

In referring to FIG. 6, at operation 602, a floor plan is generated based on one or more cell structures, the devices, and the circuit diagram. The floor plan can include the arrangement of a plurality of placeholders that match the arrangement of the cell structures and the devices in the circuit diagram. Accordingly, the relative positions of the placeholders can be consistent with the relative positions of the cell structures and the devices for subsequent process (e.g., routing). The placeholders can be any suitable symbols, shapes, and/or areas that can represent the relative positions of cell structures and the corresponding devices. In some embodiments, the height of a placeholder along the y-direction represents the cell height of a cell structure represented by the placeholder, and the length of a placeholder along the x-direction represents the total effective gate length of a cell structure represented by the placeholder. FIG. 7B illustrates an exemplary floor plan 710 generated based on the devices shown in FIG. 7A. For illustrative purposes, only a portion of the floor plan, including the PMOSFETs (e.g., P1-P6) and the current source IP1, as circled in FIG. 7A, is shown.

Floor plan 710 can be generated based on the gate lengths of the devices in FIG. 7A, and the position of each device can be adjusted to optimize the overall layout of the devices. For example, the PMOSFETs (e.g., P1-P6) and current source (e.g., IP1) can be replaced by placeholders representing the same or similar uni-gate lengths, and the placeholders can abut along the first direction and/or along the second direction. Placeholders representing non-active cell structures can abut placeholders representing active cell structures so that non-active cell structures can protect and isolate the active cell active cell structures in the subsequently-generated circuit layout, when necessary. The arrangement of the placeholders can be optimized so that a minimum layout area is occupied. The floor plan can be generated manually or automatically by the EDA tool. For example, the floor plan can be generated manually in a spreadsheet. In another example, the floor plan can be generated by the EDA tool and can include specific parameters for each of the placeholders. The floor plan generated by the EDA tool can subsequently be imported into a circuit layout.

In an embodiment, PMOSFETs P1-P6 are each replaced by one or more placeholders, and the placeholders include uni-gates of the same uni-gate length Lg. As shown in floor plan 710, P1 and P2 can each be replaced by two placeholders representing active cell structures, and the four placeholders are arranged in an interleaving configuration along the first direction (e.g., x-direction or horizontal direction) and the second direction (e.g., y-direction or vertical direction). P3 and P4 can each be replaced by two placeholders representing active cell structures that abut along the second direction. P5 and P6 can each be replaced by eight placeholders representing active cell structures, and the sixteen placeholders can be arranged in an interleaving configuration along the first direction and the second direction. IP1 can be replaced by two placeholders representing active cell structures that abut along the second direction. A plurality of placeholders representing non-active cell structures such as auxiliary/dummy cell structure (labeled as D), inner guard ring cell structures (labeled as I), and boundary guard ring cell structures (labeled as B) can be arranged between and/or around the placeholders representing active cell structures. Placeholders representing cell structures of the same cell height can abut along the first direction. In some embodiments, each cell structure for replacing P1-P6 and IP1 has the same cell height and the corresponding placeholders have the same height along the y-direction. In some embodiments, the active cell structures for replacing P1-P6 and IP1 each has a different number n of uni-gates, and the corresponding placeholders each have a different length along the x-direction. As shown in FIG. 7B, placeholders representing cell structures for replacing P3 and P4 can form block 701, placeholders representing cell structures for replacing P1 and P2 can form block 702, and placeholders representing cell structures for replacing P5 and P6 can form block 703. When floor plan 710 is generated manually, cell structures represented by floor plan 710 can be placed into a circuit layout according to their locations in floor plan 710. When floor plan 710 is generated automatically by the EDA tool, cell structures represented by floor plan 710 can be imported into a circuit layout or placed manually according to the locations of the corresponding placeholders in floor plan 710.

In referring to FIG. 6, at operation 603, a circuit layout is generated based on the floor plan, the one or more cell structures, and the circuit diagram, where the placeholders are replaced by the corresponding cell structures. FIG. 7C illustrates an exemplary circuit layout after the blocks shown in FIG. 7B is placed within. Blocks 701-703, replaced with corresponding cell structures, can be placed automatically or manually into the circuit layout according to the arrangement illustrated in FIG. 7B to optimize their total layout area in the circuit layout. As shown in FIG. 7C, blocks 701-703 can abut compactly along the second direction, according to the arrangement in FIG. 7B. Details of the cell structure abutment are described above with respect to FIGS. 3A-3D. Blocks 701-703 can further abut other blocks along the first direction and second direction, which are omitted from FIGS. 7B and 7C for simplicity.

Further, electrical connection (e.g., between a metal interconnect and a cell structure, between cell structures, and between blocks) can be formed manually or automatically (e.g., by a routing tool) in the blocks, according to the circuit diagram. For example, contact vias can be formed between a metal interconnect (e.g., M0) and a portion of a cell structure.

Because the dimensions and arrangement of cell structures (e.g., including the uni-gates and the metal interconnects included in the cell structures) are designed to comply with design rules, the blocks formed by these cell structures and the circuit layout formed by these blocks are less susceptible to violations of design rules and EM criteria compared to arbitrarily arranged long-gate structures. Meanwhile, smaller gate lengths can reduce the gate threshold voltage mismatch and output impedance. Further, because devices/structures in neighboring blocks of a circuit layout are replaced with cell structures of similar or same uni-gate lengths, the metal gate densities of these blocks can be controlled to be desirably close, and the total circuit layout is less susceptible to DGE. Further, by using non-active cell structures of the same or similar uni-gate lengths and separation structures, the cell structures that replace the long-gate structures can be more compactly abutted together, and the total layout area occupied by these cell structures can be reduced. The yield of the IC can be improved and the manufacturing can be less costly.

Figure 8:
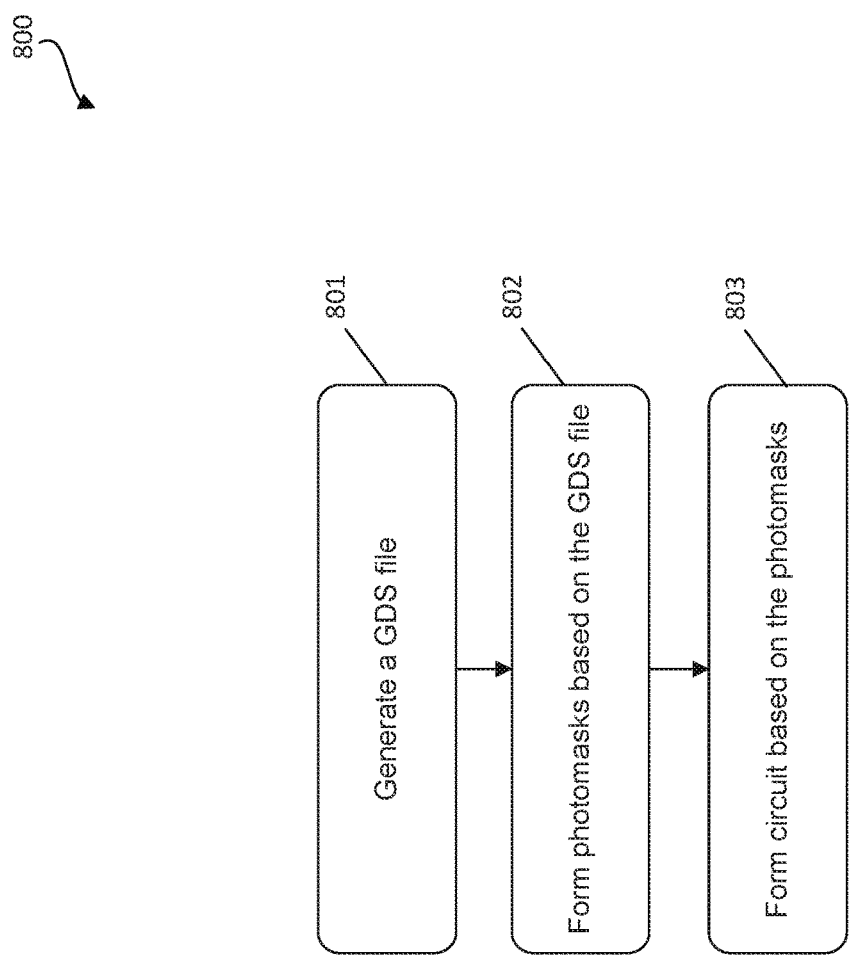
FIG. 8 is an illustration of a process to form a circuit based on a graphic database system (GDS) file, according to some embodiments.

FIG. 8 is an illustration of an exemplary method 800 for circuit fabrication, according to some embodiments. In some embodiments, operations/steps of method 800 can be performed in a different order. Variations in the operations of method 800 are within the scope of the present disclosure.

In operation 801, a GDS file is generated. The GDS file can be generated by an EDA tool and can include the cell structures of uni-gates based on the present disclosure. The operation depicted in 801 can be performed by, for example, an EDA tool that operates on a computer system, such as computer system 900 described below.

In operation 802, photomasks are formed based on the GDS file. In some embodiments, the GDS file provided in operation 801 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 802 can be performed by a suitable software tool (e.g., an EDA tool) and the circuit layout is transferred onto a substrate using a suitable printing/deposition tool. The photomasks reflect the circuit layout/features included in the GDS file.

In operation 803, one or more circuits are formed based on the photomasks generated in operation 802. In some embodiments, the photomasks are used to form patterns/structures of the circuit included in the GDS file. In some embodiments, various fabrication tools (e.g., photolithography equipment, deposition equipment, and etching equipment) are used to form features of the one or more circuits.

Figure 9:
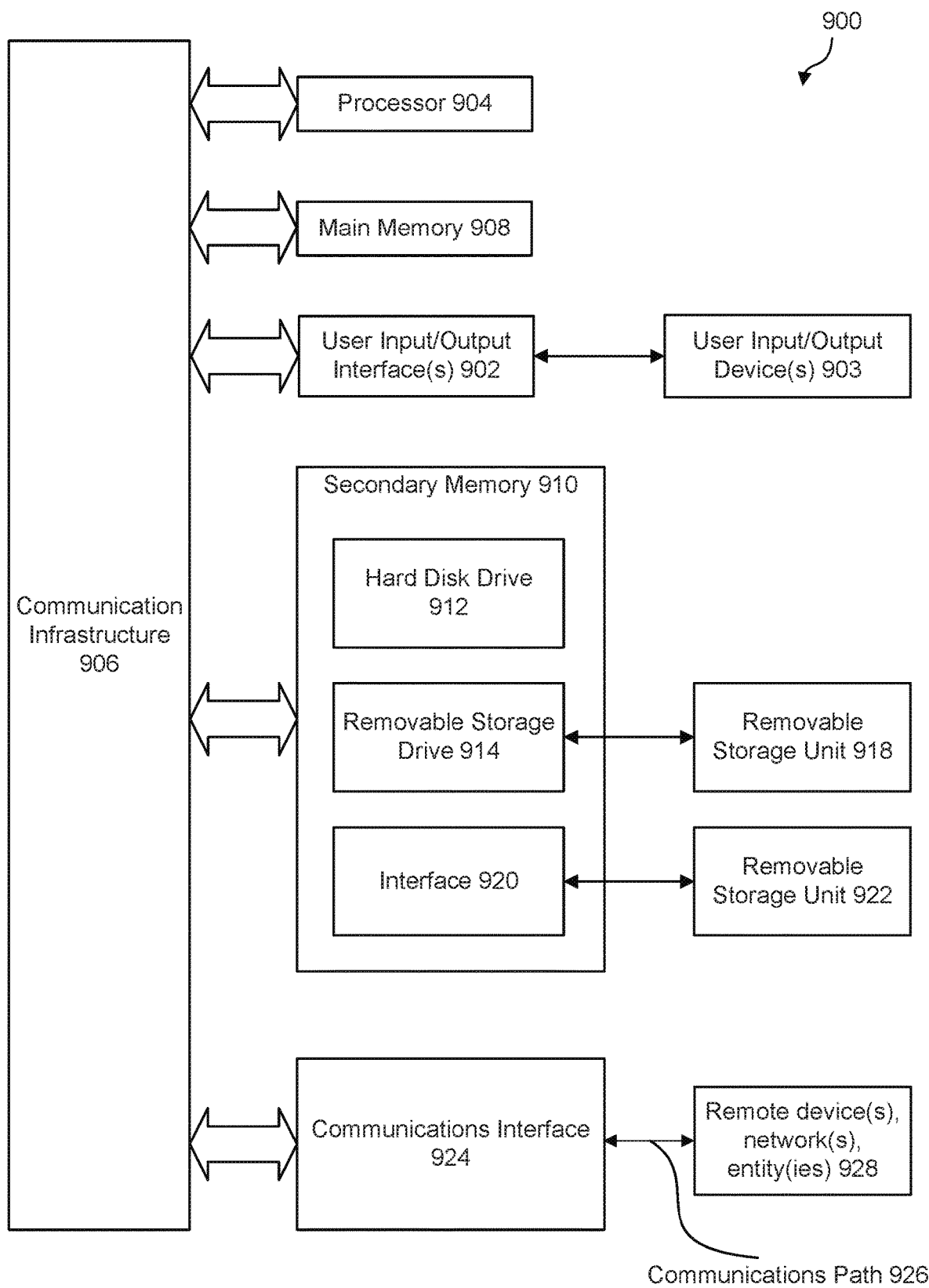
FIG. 9 is an illustration of an example computer system for implementing various embodiments.

FIG. 9 is an illustration of an example computer system 900 in which various embodiments of the present disclosure can be implemented, according to some embodiments. Computer system 900 can be any well-known computer capable of performing the functions and operations described herein. For example, and without limitation, computer system 900 can be capable of selecting standard cells to be optimized and placing metal cuts at desired locations in the standard cells, for example, an EDA tool. Computer system 900 can be used, for example, to execute one or more operations in method 600, which describes an example method for replacing long-gate structures with cell structures in a layout area. Computer system can also be used to execute one or more operations in method 800.

Computer system 900 includes one or more processors (also called central processing units, or CPUs), such as a processor 904. Processor 904 is connected to a communication infrastructure or bus 906. Computer system 900 also includes input/output device(s) 903, such as monitors, keyboards, pointing devices, etc., that communicate with communication infrastructure or bus 906 through input/output interface(s) 902. An EDA tool can receive instructions to implement functions and operations described herein—e.g., method 600 of FIG. 6 and/or method 800 of FIG. 8 via input/output device(s) 903. Computer system 900 also includes a main or primary memory 908, such as random access memory (RAM). Main memory 908 can include one or more levels of cache. Main memory 908 has stored therein control logic (e.g., computer software) and/or data. In some embodiments, the control logic (e.g., computer software) and/or data can include one or more of the operations described above with respect to method 600 of FIG. 6 and/or method 800 of FIG. 8.

Computer system 900 can also include one or more secondary storage devices or memory 910. Secondary memory 910 can include, for example, a hard disk drive 912 and/or a removable storage device or drive 914. Removable storage drive 914 can be a floppy disk drive, a magnetic tape drive, a compact disk drive, an optical storage device, tape backup device, and/or any other storage device/drive.

Removable storage drive 914 can interact with a removable storage unit 918. Removable storage unit 918 includes a computer usable or readable storage device having stored thereon computer software (control logic) and/or data. Removable storage unit 918 can be a floppy disk, magnetic tape, compact disk, DVD, optical storage disk, and/any other computer data storage device. Removable storage drive 914 reads from and/or writes to removable storage unit 918 in a well-known manner.

According to some embodiments, secondary memory 910 can include other means, instrumentalities or other approaches for allowing computer programs and/or other instructions and/or data to be accessed by computer system 900. Such means, instrumentalities or other approaches can include, for example, a removable storage unit 922 and an interface 920. Examples of the removable storage unit 922 and the interface 920 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 910, removable storage unit 918, and/or removable storage unit 922 can include one or more of the operations described above with respect to method 600 of FIG. 6 and/or method 800 of FIG. 8.

Computer system 900 can further include a communication or network interface 924. Communication interface 924 enables computer system 900 to communicate and interact with any combination of remote devices, remote networks, remote entities, etc. (individually and collectively referenced by reference number 928). For example, communication interface 924 can allow computer system 900 to communicate with remote devices 928 over communications path 926, which can be wired and/or wireless, and which can include any combination of LANs, WANs, the Internet, etc. Control logic and/or data can be transmitted to and from computer system 900 via communication path 926.

The operations in the preceding embodiments can be implemented in a wide variety of configurations and architectures. Therefore, some or all of the operations in the preceding embodiments—e.g., method 600 of FIG. 6 and/or method 800 of FIG. 8—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 900, main memory 908, secondary memory 910 and removable storage units 918 and 922, as well as tangible articles of manufacture embodying any combination of the foregoing. Such control logic, when executed by one or more data processing devices (such as computer system 900), causes such data processing devices to operate as described herein. In some embodiments, computer system 900 is installed with software to perform operations in the manufacturing of photomasks and circuits, as illustrated in method 800 of FIG. 8. In some embodiments, computer system 900 includes hardware/equipment for the manufacturing of photomasks and circuit fabrication. For example, the hardware/equipment can be connected to or be part of element 928 (remote device(s), network(s), entity(ies) 928) of computer system 900.

The present disclosure methods and structures for using cell structures that includes uni-gates to replace long-gate structures in devices in layout blocks. According to the embodiments, the gate of a long-gate structure can be replaced by a cell structure that includes a plurality of uni-gates (e.g., with the same uni-gate length) stacked together, and the long-gate structures in a block can be replaced by a plurality of cell structures with the same or similar uni-gate lengths. Compared with blocks including long-gate structures, blocks including the cell structures of the same or similar uni-gate lengths are less susceptible to gate threshold voltage mismatch and have lower output impedance. Further, in a block, cell structures of opposite polarity types (e.g., N type and P type) and having the same uni-gate length and cell height can abut along the cell boundaries (e.g., in an interleaving configuration) and be connected to one another with metal interconnects, reducing the layout area. Devices including uni-gates of the same uni-gate length and cell height can be abutted with less transitional cells, further reducing the layout area.

Further, because neighboring blocks can include cell structures with the same or similar uni-gate lengths, uniformity in metal gate densities of the blocks can be improved, and DGE between neighboring blocks can be reduced or prevented. As a result, a higher IC yield can be obtained. Also, the arrangement of metal interconnects in and between the cell structures can be optimized to satisfy electromigration (EM) criteria of the IC, and the arrangement of the parts in the cell structures (e.g., uni-gates and metal interconnects) can be optimized to comply with design rules. Accordingly, a block formed by a plurality of cell structures to can pass design-rule check (DRC) and satisfy EM criteria more easily. The design efficiency of the IC can thus be increased (e.g., increased by up to about 200%).

Further, because the cell structures can be defined and stored in the library to replace devices/structures of different gate lengths, the number of uni-gates included in a cell structure and/or the uni-gate length of the cell structure can be flexibly defined for different application and design requirements. By changing the cell structures (e.g., uni-gate length of the cell structures) defined in the library, the cell structures in the blocks/circuit can be changed/updated automatically. For example, when the defined cell structures have a uni-gate length associated with a particular technology node and the technology node transitions to a smaller feature size (e.g. from 7 nm to 6 nm), the uni-gate length in a cell structure can be changed/updated accordingly. Thus, a new circuit layout does not need to be developed when the technology node changes, thus reducing IC manufacturing costs.

In some embodiments, a method for replacing a device with a cell structure having a plurality of uni-gates includes receiving a circuit diagram that includes the device, determining the cell structure wherein a cumulative effective gate length of the plurality of uni-gates is equal to a gate length of the device, generating, based on the cell structure and the device, a floor plan that includes an arrangement of a plurality of placeholders that match an arrangement of the cell structure and an arrangement of the device in the circuit diagram, and generating a circuit layout based on the floor plan, the cell structure, and the circuit diagram. The plurality of placeholders is replaced by the cell structure and the cell structure is connectable to other parts of the circuit diagram based on the circuit diagram.

In some embodiments, a non-transitory computer-readable medium includes computer-executable program for, when being executed by a processor, implementing a method for replacing a device with a cell structure having a plurality of uni-gates. The method includes receiving a circuit diagram that includes the device, determining the cell structure wherein a cumulative effective gate length of the plurality of uni-gates is equal to a gate length of the device, generating, based on the cell structure and the device, a floor plan that includes an arrangement of a plurality of placeholders that match an arrangement of the cell structure and an arrangement of the device in the circuit diagram, and generating a circuit layout based on the floor plan, the cell structure, and the circuit diagram. The plurality of placeholders is replaced by the cell structure and the cell structure is connectable to other parts of the circuit diagram based on the circuit diagram.

In some embodiments, computer system for replacing a device with a cell structure having a plurality of uni-gates includes a memory configured for storing a program and data for replacing the device with the cell structure, and a user interface configured for receiving information from a user. The computer system also includes a processor configured to receive a circuit diagram that includes the device; determine the cell structure wherein a cumulative effective gate length of the plurality of uni-gates is equal to a gate length of the device; generate, based on the cell structure and the device, a floor plan that includes an arrangement of a plurality of placeholders that match an arrangement of the cell structure and an arrangement of the device in the circuit diagram; and generate a circuit layout based on the floor plan, the cell structure, and the circuit diagram. The plurality of placeholders is replaced by e cell structure and the cell structure is connectable to other parts of the circuit diagram based on the circuit diagram.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
   receiving a circuit diagram that includes a first active device and a second active device;
   determining a first active cell structure for the first active device, a first transitional cell structure for a first transitional device associated with the first active cell structure, a second active cell structure for the second active device, and a second transitional cell structure for a second transitional device associated with the second active cell structure, wherein each of the first active cell structure, the first transitional cell structure, the second active cell structure, and the second transitional cell structure comprises a plurality of uni-gates having a common uni-gate length and a cumulative effective gate length of the plurality of uni-gates is equal to a gate length of each of the first active device, the first transitional device, the second active device, and the second transitional device;
   generating, based on the first and second active cell structures, the first and second transitional cell structures, and the first and second active devices, a floor plan that comprises an arrangement of a plurality of placeholders that match an arrangement of the first and second active cell structures and an arrangement of the first and second active devices in the circuit diagram; and
   generating a circuit layout based on the floor plan, the first and second active cell structures, the first and second transitional cell structures, and the circuit diagram, wherein the plurality of placeholders are replaced by the first and second active cell structures and the first and second transitional cell structures, the first and second transitional cell structures abut each other and separate the first and second active cell structures, and the first and second active cell structures are connectable to other parts of the circuit diagram based on the circuit diagram.

2. The method of claim 1, wherein:
   the arrangement of the first and second active devices comprises a position of the first and second active devices and an electrical connection to the first and second active devices; and
   the arrangement of the first and second active cell structures comprises a position of the first and second active cell structures and an electrical connection to a plurality of metal interconnects of the first and second active cell structures.

3. The method of claim 1, further comprising replacing a third active device in the circuit diagram with a third active cell structure that comprises another plurality of uni-gates, wherein:
   the other plurality of uni-gates has another common uni-gate length and a cumulative effective gate length of the other plurality of uni-gates is equal to a gate length of the third active device;
   the first active cell structure and the third active cell structure abut along a vertical direction;
   an electrical connection of the first active cell structure and the second active cell structure along the horizontal direction comprises connections of a plurality of metal interconnects associated with the first active cell structure and another plurality of metal interconnects associated with the second active cell structure; and
   an electrical insulation of the first active cell structure and the third active cell structure along the vertical direction comprises insulation by one or more separation structures at boundaries of the first active cell structure and the third active cell structure.

4. The method of claim 3, wherein the first active cell structure and the third active cell structure insulated by the one or more separation structures have a same uni-gate length.

5. The method of claim 3, wherein the other common uni-gate length is equal to the common uni-gate length.

6. The method of claim 1, wherein the first transitional cell structure and the second transitional cell structure abut along a horizontal direction, and the first and second active cell structures have a same cell height, have a same number of uni-gates, and have a same polarity type.

7. The method of claim 1, further comprising:
   replacing a third active device in the circuit diagram with a third active cell structure; and
   replacing a third transitional device associated with the third active cell structure with a third transitional cell structure, wherein:
   the first and third transitional cell structures abut each other along a horizontal direction and separate the first and third active cell structures; and
   each of the third active cell structure and the third transitional cell structure comprise another plurality of uni-gates connected in series, the other plurality of uni-gates having another common uni-gate length and a cumulative effective gate length of the other plurality of uni-gates being equal to a gate length of each of the third active device and the third transitional device.

8. The method of claim 7, wherein, in response to the first active cell structure and the third active cell structure having a same device type, having equal uni-gate lengths, and having a same cell height,
   abutting the first active cell structure with the first transitional cell structure on one side along the horizontal direction;
   abutting the third active cell structure with the third transitional cell structure on an opposite side along the horizontal direction; and
   abutting the first transitional cell structure and the third transitional cell structure along the horizontal direction, wherein the first and second transitional cell structures are inner guard ring cell structures.

9. The method of claim 7, wherein, in response to the first active cell structure and the third active cell structure being different device types, having different uni-gate lengths, and having different cell heights,
   abutting the first active cell structure with the first transitional cell structure on one side along the horizontal direction;
   abutting the third active cell structure with the third transitional cell structure on an opposite side along the horizontal direction;

facing the first transitional cell structure to the third transitional cell structure; and separating the first transitional cell structure and the third transitional cell structure by a minimum spacing along the horizontal direction, wherein the first transitional cell structure and the third transitional cell structure are boundary guard ring cell structures and the minimum spacing is about 100 nm to about 300 nm.

10. The method of claim 1, further comprising:

flipping the first active cell structure along the vertical direction to form a flipped active cell structure;

abutting the first active cell structure and the flipped active cell structure on a same side of the first transitional cell structure along the vertical direction;

abutting the first transitional cell structure with the second transitional cell structure on one side along the horizontal direction; and abutting the second transitional cell structure with the second active cell structure on an opposite side along the horizontal direction, wherein:

the first active cell structure and the flipped active cell structure are insulated by one or more separation structures;

the second active cell structure and the flipped active cell structure are separated by the first and second transitional cell structures; and a cell height of the second active cell structure is twice a cell height of the first active cell structure.

11. The method of claim 1, further comprising:

replacing a third active device in the circuit diagram with a third active cell structure, wherein the first active cell structure and the third active cell structure abut each other on one side of the third active cell structure along a horizontal direction;

replacing a fourth active device in the circuit diagram with a fourth active cell structure, wherein the fourth and third active cell structures abut each other on an opposite side of the third active cell structure along the horizontal direction; and replacing a fifth active device in the circuit diagram with a fifth active cell structure, wherein:

the fifth active cell structure abuts another side of the fourth active cell structure different from the third active cell structure along the horizontal direction, each of the first active cell structure and the fourth active cell structure has a first number of uni-gates, each of the fifth active cell structure and the third active cell structure has a second number of uni-gates, and the second number is different from the first number.

12. A non-transitory computer-readable medium including computer-executable program for, when being executed by a processor, implementing a method, comprising:

receiving a circuit diagram that includes a first active device and a second active device;

determining a first active cell structure for the first active device, a first transitional cell structure for a first transitional device associated with the first active cell structure, a second active cell structure for the second active device, and a second transitional cell structure for a second transitional device associated with the second active cell structure, wherein each of the first active cell structure, the first transitional cell structure, the second active cell structure, and the second transitional cell structure comprises a plurality of uni-gates having a common uni-gate length and a cumulative effective gate length of the plurality of uni-gates is equal to a gate length of each of the first active device, the first transitional device, the second active device, and the second transitional device;

generating, based on the first and second active cell structures, the first and second transitional cell structures, and the first and second active devices, a floor plan that comprises an arrangement of a plurality of placeholders that match an arrangement of the first and second active cell structures and an arrangement of the first and second active devices in the circuit diagram; and generating a circuit layout based on the floor plan, the first and second active cell structures, the first and second transitional cell structures, and the circuit diagram, wherein the plurality of placeholders are replaced by the first and second active cell structures and the first and second transitional cell structures, the first and second transitional cell structures abut each other and separate the first and second active cell structures, and the first and second active cell structures are connectable to other parts of the circuit diagram based on the circuit diagram.

13. The non-transitory computer-readable medium of claim 12, wherein:

the arrangement of the first and second active devices comprises a position of the first and second active devices and an electrical connection to the first and second active devices; and the arrangement of the first and second active cell structures comprises a position of the first and second active cell structures and an electrical connection to a plurality of metal interconnects of the first and second active cell structures.

14. The non-transitory computer-readable medium of claim 12, wherein the method further comprises replacing a third active device in the circuit diagram with a third active cell structure that comprises another plurality of uni-gates, and wherein:

the other plurality of uni-gates has another common uni-gate length and a cumulative effective gate length of the other plurality of uni-gates is equal to a gate length of the third active device;

the first active cell structure and the third active cell structure abut along a vertical direction;

an electrical connection of the first active cell structure and the second active cell structure along the horizontal direction comprises connections of a plurality of metal interconnects associated with the first active cell structure and another plurality of metal interconnects associated with the second active cell structure; and an electrical insulation of the first active cell structure and the third active cell structure along the vertical direction comprises insulation by one or more separation structures at boundaries of the first active cell structure and the third active cell structure.

15. The non-transitory computer readable medium of claim 14, wherein the first active cell structure and the third active cell structure insulated by the one or more separation structures have a same uni-gate length.

16. The non-transitory computer-readable medium of claim 12, wherein the first transitional cell structure and the second transitional cell structure abut along a horizontal direction, and the first and second active cell structures have a same cell height, have a same number of uni-gates, and have a same polarity type.

17. The non-transitory computer readable medium of claim 12, wherein the method further comprises:

replacing a third active device in the circuit diagram with a third active cell structure; and replacing a third transitional device associated with the third active cell structure with a third transitional cell structure, wherein:

the first and third transitional cell structures abut each other along a horizontal direction and separate the first and third active cell structures; and each of the third active cell structure and the third transitional cell structure comprise another plurality of uni-gates connected in series, the other plurality of uni-gates having another common uni-gate length and a cumulative effective gate length of the other plurality of uni-gates being equal to a gate length of each of the third active device and the third transitional device;

abutting the first active cell structure with the first transitional cell structure on one side along the horizontal direction;

abutting the third active cell structure with the third transitional cell structure on an opposite side along the horizontal direction;

facing the first transitional cell structure to the third transitional cell structure; and separating the first transitional cell structure and the third transitional cell structure by a minimum spacing along the horizontal direction, wherein the first transitional cell structure and the third transitional cell structure are boundary guard ring cell structures.

18. A computer system comprising:

a memory configured for storing a program and data for providing a cell structure; a user interface configured for receiving information from a user; and a processor configured to:

receive a circuit diagram that includes a first active device and a second active device;

determine a first active cell structure for the first active device, a first transitional cell structure for a first transitional device associated with the first active cell structure, a second active cell structure for the second active device, and a second transitional cell structure for a second transitional device associated with the second active cell structure, wherein each of the first active cell structure, the first transitional cell structure, the second active cell structure, and the second transitional cell structure comprises a plurality of uni-gates having a common uni-gate length and a cumulative effective gate length of the plurality of uni-gates is equal to a gate length of each of the first active device, the first transitional device, the second active device, and the second transitional device;

generate, based on the first and second active cell structures, the first and second transitional cell structures, and the first and second active devices, a floor plan that comprises an arrangement of a plurality of placeholders that match an arrangement of the first and second active cell structures and an arrangement of the first and second active devices in the circuit diagram; and generate a circuit layout based on the floor plan, the first and second active cell structures, the first and second transitional cell structures, and the circuit diagram, wherein the plurality of placeholders are replaced by the first and second active cell structures and the first and second transitional cell structures, the first and second transitional cell structures abut each other and separate the first and second active cell structures, and the first and second active cell structures are connectable to other parts of the circuit diagram based on the circuit diagram.

19. The computer system of claim 18, wherein:

the arrangement of the first and second active devices comprises a position of the first and second active devices and an electrical connection to the first and second active devices; and the arrangement of the first and second active cell structure comprises a position of the first and second active cell structures and an electrical connection to a plurality of metal interconnects of the first and second active cell structures.

20. The computer system of claim 18, wherein the processor is further configured to replace a third active device in the circuit diagram with a third active cell structure that comprises another plurality of uni-gates, and wherein:

the other plurality of uni-gates has another common uni-gate length and a cumulative effective gate length of the other plurality of uni-gates is equal to a gate length of the third active device;

the first active cell structure and the third active cell structure abut along a vertical direction;

an electrical connection of the first active cell structure and the second active cell structure along the horizontal direction comprises connections of a plurality of metal interconnects associated with the first active cell structure and another plurality of metal interconnects associated with the second active cell structure; and an electrical insulation of the first active cell structure and the third active cell structure along the vertical direction comprises insulation by one or more separation structures at boundaries of the first active cell structure and the third active cell structure.

* * * * *